United States Patent
Bruel

(10) Patent No.: US 9,529,687 B2
(45) Date of Patent: Dec. 27, 2016

(54) METHOD FOR DETERMINING A POWER CONSUMPTION IN AN ELECTRIC INSTALLATION AND ALTERNATING CURRENT ELECTRIC INSTALLATION

(71) Applicant: SCHNEIDER ELECTRIC INDUSTRIES SAS, Rueil-Malmaison (FR)

(72) Inventor: Marc Bruel, Corenc (FR)

(73) Assignee: SCHNEIDER ELECTRIC INDUSTRIES SAS, Rueil-Malmaison (FR)

(*) Notice: Subject to any disclaimer, the term of this patent is extended or adjusted under 35 U.S.C. 154(b) by 295 days.

(21) Appl. No.: 14/364,891

(22) PCT Filed: Dec. 7, 2012

(86) PCT No.: PCT/FR2012/052829
§ 371 (c)(1),
(2) Date: Jun. 12, 2014

(87) PCT Pub. No.: WO2013/093280
PCT Pub. Date: Jun. 27, 2013

(65) Prior Publication Data
US 2014/0343742 A1 Nov. 20, 2014

(30) Foreign Application Priority Data

Dec. 20, 2011 (FR) ...................... 11 03955

(51) Int. Cl.
*G06F 11/30* (2006.01)
*G01R 21/06* (2006.01)
(Continued)

(52) U.S. Cl.
CPC ........... *G06F 11/3062* (2013.01); *G01R 21/06* (2013.01); *G01R 21/133* (2013.01); *G06Q 50/06* (2013.01); *G01R 19/2513* (2013.01)

(58) Field of Classification Search
CPC ... G01R 21/133; G01R 21/06; G01R 19/2513; G01R 22/061; G01R 19/10; G01R 11/00; G01R 13/00; G01R 19/00; G01R 21/00; G01R 22/00; G01R 25/00; G01R 27/00; G01R 29/00; G01R 33/00; G01R 19/0092
(Continued)

(56) References Cited

U.S. PATENT DOCUMENTS

| 5,572,438 A | 11/1996 | Ehlers et al. |
| 5,684,710 A | 11/1997 | Ehlers et al. |

(Continued)

FOREIGN PATENT DOCUMENTS

| EP | 0 853 364 A2 | 7/1998 |
| EP | 2 000 780 A1 | 12/2008 |

(Continued)

OTHER PUBLICATIONS

Schneider Electric, Harness the data collected from your energy system: PowerLogic System Manager Software (2009).*

(Continued)

*Primary Examiner* — Jermele M Hollington
*Assistant Examiner* — Robert P Alejnikov, Jr.
(74) *Attorney, Agent, or Firm* — Oblon, McClelland, Maier & Neustadt, L.L.P.

(57) ABSTRACT

A group including a plurality of individual distribution branches connected in parallel is connected to an alternating-current power supply. A method includes: a) detection of a change in the electrical consumption of one specific branch among the branches; and b) determination of individual power consumption of the specific branch, based on a measurement of the total voltage, which is substantially constant during the change, measurements of intensity and (Continued)

phase shift values of the total current before and after the change, and measurements of intensities of individual current in the specific branch before and after the change.

12 Claims, 3 Drawing Sheets

(51) Int. Cl.
*G01R 21/133* (2006.01)
*G06Q 50/06* (2012.01)
*G01R 19/25* (2006.01)

(58) Field of Classification Search
USPC ........ 324/140 R, 103 R, 113, 114, 141, 157; 702/57, 60, 61, 64
See application file for complete search history.

(56) References Cited

U.S. PATENT DOCUMENTS

| | | |
|---|---|---|
| 5,696,695 A | 12/1997 | Ehlers et al. |
| 7,693,670 B2 | 4/2010 | Durling et al. |
| 8,463,452 B2 | 6/2013 | Masters et al. |
| 8,554,501 B2 | 10/2013 | Diop et al. |
| 2008/0140326 A1 | 6/2008 | Scholtz et al. |
| 2009/0045804 A1* | 2/2009 | Durling ............... G01D 4/008 324/140 R |
| 2009/0088990 A1 | 4/2009 | Schweitzer, III et al. |
| 2009/0322314 A1* | 12/2009 | Long ............... G01R 21/133 324/142 |
| 2010/0030393 A1 | 2/2010 | Masters et al. |
| 2010/0287489 A1 | 11/2010 | Alles |
| 2010/0301837 A1 | 12/2010 | Higuma et al. |
| 2011/0074382 A1 | 3/2011 | Patel |
| 2011/0098952 A1 | 4/2011 | Long et al. |
| 2011/0153246 A1* | 6/2011 | Donaldson ......... G01R 21/1331 702/65 |
| 2011/0161021 A1* | 6/2011 | Reid ................ G01R 19/2513 702/61 |
| 2011/0191041 A1 | 8/2011 | Diop et al. |
| 2012/0290230 A1 | 11/2012 | Berges Gonzalez et al. |

FOREIGN PATENT DOCUMENTS

| | | |
|---|---|---|
| EP | 2 026 299 A1 | 2/2009 |
| EP | 2 241 898 A1 | 10/2010 |
| JP | 2003-70186 A | 3/2003 |
| WO | WO 2009/158202 A1 | 12/2009 |
| WO | WO 2010/014762 A1 | 2/2010 |
| WO | WO 2010/037988 A1 | 4/2010 |
| WO | WO 2011/002735 A1 | 1/2011 |
| WO | WO 2011/037679 A1 | 3/2011 |

OTHER PUBLICATIONS

U.S. Appl. No. 14/366,565, filed Jun. 18, 2014, Bruel.
International Search Report Issued Feb. 4, 2013 in Patent Application No. PCT/FR2012/052829.
Chung-Ping Young, et al., "Digital Power Metering Manifold" IEEE Transactions on Instrumentation and Measurement, vol. 47, No. 1, XP 011024460, Feb. 1998, pp. 224-228.

* cited by examiner

US 9,529,687 B2

METHOD FOR DETERMINING A POWER CONSUMPTION IN AN ELECTRIC INSTALLATION AND ALTERNATING CURRENT ELECTRIC INSTALLATION

BACKGROUND OF THE INVENTION

The invention relates to a method for determining a power consumption in an electrical installation, in which a group of several individual distribution branches connected in parallel is connected to an alternating current power supply. The method in question is of the type comprising the action of performing in time and of recording measurements of the overall supply voltage of the group of several branches, and measurements of the intensity and phase shift values of the overall supply current of this group.

The invention also relates to an alternating current electrical installation of the type comprising a group of several individual distribution branches connected in parallel, and a monitoring system designed to perform in time and to record measurements of an overall supply voltage of the group of several branches, and measurements of the intensity and phase shift values of the overall supply current of this group.

STATE OF THE ART

Private individuals like other economical agents are showing an increasing interest in mastering their own electrical consumptions. One direction of this consumption control is based on a detailed knowledge of the different specific consumptions within an overall consumption. For example, the inhabitants of a house or a lodging of another type may be interested in their electrical consumption due to heating, in that devoted to lighting and/or that due to a specific piece of equipment, without satisfying themselves with only knowing the overall consumption of the lodging as a whole.

At the present time, the inhabitants of a lodging can generally have access to their overall electrical consumption by means of an electricity meter equipping the connection line to the public distribution grid which supplies the lodging. When it is desired to know an individual consumption for example of a specific piece of equipment within the lodging, the branch on which this piece of equipment is connected is equipped with an electricity consumption meter. The appended FIG. 6 is a diagram representing an example of a current domestic electrical installation in which several electricity consumption meters 101 provide information on several individual consumptions constituting an overall electricity consumption.

In this FIG. 6, the reference 102 designates a transformer connecting to a public electrical power distribution grid. A line-side incomer equipped with electricity consumption meter 103 connects the electrical installation to this transformer 102. Identical or similar to the meter 103, each electricity consumption meter 101 equips one of several electrical power distribution feeders to several loads 104. A hardwired network is provided to convey the different meter readings to a central electronic measurement unit 105 which groups the meter readings.

An electricity consumption meter is both costly and bulky. When it is desired to be able to monitor several individual power consumptions within an installation, the additional cost resulting from multiplication of the electricity consumption meters becomes consequent and may constitute a genuine obstacle to setting up a real individual consumption monitoring system. The possibility of such a multiplication of meters may in addition be hindered by the lack of available space in a number of general electrical panels currently installed in private homes.

OBJECT OF THE INVENTION

The object of the invention is at least to enable a reduction of the cost of access to knowing an individual electricity consumption constituting an overall measured electricity consumption within an alternating current electrical installation.

According to the invention, this object is achieved by means of a method of the above-mentioned type further comprising the action of performing in time and of recording measurements of the intensity of a specific individual current flowing in a specific branch among the branches of the group. The method according to the invention comprises steps in which:

a) a change in the electrical consumption in the specific branch is detected,
b) using a measurement of the overall voltage which is substantially constant during the change, measurements of the intensity and phase shift values of the overall current before and after the change, and measurements of the intensities of the individual current before and after the change, a specific individual power consumed in the specific branch is determined.

The invention takes advantage of the observation according to which information can be deduced from a change of the power consumed in a branch if data on operation before the change is combined with data on operation after this change.

The method according to the invention enables an individual power to be determined in a specific branch among several branches from measurements of current in this specific branch, provided that values characterizing the overall electrical power supply of the set of branches are available. In particular, the individual power consumed in the specific branch is determined in the absence of a direct measurement of the phase shift of the current in this specific branch, whereas a direct calculation of an electrical power is based, in sinusoidal current, on knowledge of the voltage between two terminals, of the intensity of the current flowing between these two terminals and of the phase shift between the voltage and the current.

Availability of a measurement of the quantities characterizing the overall electrical power supply of a set of several branches in parallel is a commonplace case in electrical power distribution. This case is in particular that of electrical installations in which several feeders are connected to a single incomer connected to a public power distribution grid and in which this incomer is equipped with an electricity consumption meter. In such a case, the method according to the invention enables the specific branch whose consumption is to be monitored to be equipped only with an ampere meter. An ampere meter is however generally much less expensive and less bulky than an electric power consumption meter.

The method for determining an electrical power consumption according to the invention can incorporate one or more other advantageous features, alone or in combination, in particular among those defined in the following.

Advantageously, in step b), the specific individual power is determined considering that the set of individual currents flowing in the branches of the group with the exception of the specific individual current add up to a substantially unchanged sum on completion of the change, compared with before the change, and that the following two conditions have to be simultaneously fulfilled:
the overall current before the change has to be substantially equal to the addition of the substantially unchanged sum to the specific individual current before the change, and
the overall current after the change has to be substantially equal to the addition of the substantially unchanged sum to the specific individual current after the change.

Advantageously step b) comprises sub-steps in which:
b1) using measurements of the intensity and phase shift values of the overall current before and after the change, and measurements of the intensities of the specific individual current before and after the change, said substantially unchanged sum of individual currents is determined,
b2) it is determined which component has to be added to the substantially unchanged sum of individual currents to obtain the overall current, this component being a determination of the specific individual current,
b3) the specific individual power is calculated as being the product of the overall voltage and of the specific individual current.

Advantageously, in sub-step b1), said substantially unchanged sum of individual currents is determined as simultaneously complying with said two conditions.

Advantageously, in sub-step b1), said substantially unchanged sum of individual currents is determined by numerically solving the following system of two equations with two unknowns:

$$\begin{cases} (X_A - X_S)^2 + (Y_A - Y_S)^2 = I_{3A}^2 \\ (X_B - X_S)^2 + (Y_B - Y_S)^2 = I_{3B}^2 \end{cases}$$

where $I_{3A}^2$ and $I_{3B}^2$ are respectively a measurement to the square of the intensity of the specific individual current before the change and a measurement to the square of the intensity of the specific individual current after the change, where $X_A$ and $Y_A$ are respectively the x-axis and the y-axis of the vector representation of the overall current as measured before the change, in a Fresnel diagram,
where $X_B$ and $Y_B$ are respectively the x-axis and the y-axis of the vector representation of the overall current as measured after the change, in the Fresnel diagram,
and where $X_S$ and $Y_S$ are two unknowns and are respectively the x-axis and the y-axis of the vector representation of said substantially unchanged sum of individual currents, in the Fresnel diagram, before and after the change.

Advantageously step b) comprises sub-steps in which:
an intensity value AB is determined by means of the following relation:

$$AB = \sqrt{I_A^2 + I_B^2 - 2 \times I_A \times I_B \times \cos(\psi_B - \psi_A)}$$

where $I_A$ and $\psi_A$ are respectively a measured intensity and phase shift of the overall current before the change and where $I_B$ and $\psi_B$ are respectively a measured intensity and phase shift of the overall current after the change,
an angle value $\psi_1$ is determined by means of the following relation:

$$\psi_1 = \arcsin\left(\frac{I_B \times \cos\psi_B - I_A \times \cos\psi_A}{AB}\right),$$

an angle value $\psi_2$ is determined by means of the following relation:

$$\psi_2 = \arccos\left(\frac{I_{3B}^2 + AB^2 - I_{3A}^2}{2 \times I_{3B} \times AB}\right)$$

where $I_{3A}$ and $I_{3B}$ are respectively a measurement of the intensity of the specific individual current before the change and a measurement of the intensity of the specific individual current after the change.

Advantageously step b) comprises a sub-step in which:
the specific individual power after the change is determined by means of the following relation:

$$P_{3B} = U \times I_{3B} \times \sin(\psi_1 + \psi_2)$$

where $P_{3B}$ and U are respectively said specific individual power after the change and measurement of the overall voltage.

Advantageously, the method for determining a power consumption comprises a step in which:
the phase shift of the specific individual current after the change is determined by means of the following relation:

$$\psi_{3B} = \pi/2 - (\psi_1 + \psi_2)$$

where $\psi_{3B}$ is the phase shift of the specific individual current after the change.

Advantageously in step b), an aberrant solution among two possible solutions is eliminated.

The object of the invention is also to provide an electrical installation of the above-mentioned type the monitoring system of which is suitable to perform in time and to record measurements of the intensity of a specific individual current flowing in a specific branch among the branches of the group, the monitoring system comprising a computing device able:
to detect a change in the electricity consumption in the specific branch,
using a measurement of the overall voltage which is substantially constant during the change, measurements of the intensity and phase shift values of the overall current before and after the change, and measurements of the intensities of the specific individual current before and after the change, to determine a specific individual power consumed in the specific branch.

The electrical installation according to the invention can incorporate one or more other advantageous features, either alone or in combination. In particular, the computing device is advantageously able to conduct a method as defined in the foregoing.

BRIEF DESCRIPTION OF THE DRAWINGS

Other advantages and features will become more clearly apparent from the following description of specific embodiments of the invention given for non-restrictive example purposes only, and represented in the appended drawings, among which.

Figure 6:
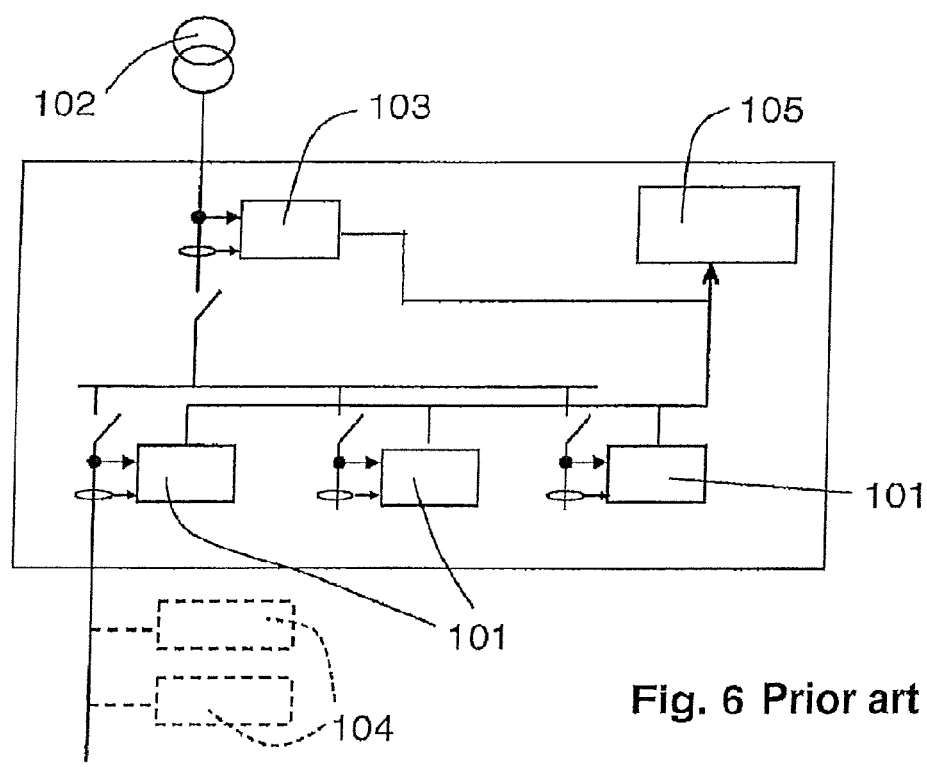

The appended figures further include a FIG. 6, which is a simplified electrical diagram of an electrical installation according to an art prior to the invention.

DESCRIPTION OF A PREFERRED EMBODIMENT OF THE INVENTION

Figure 1:
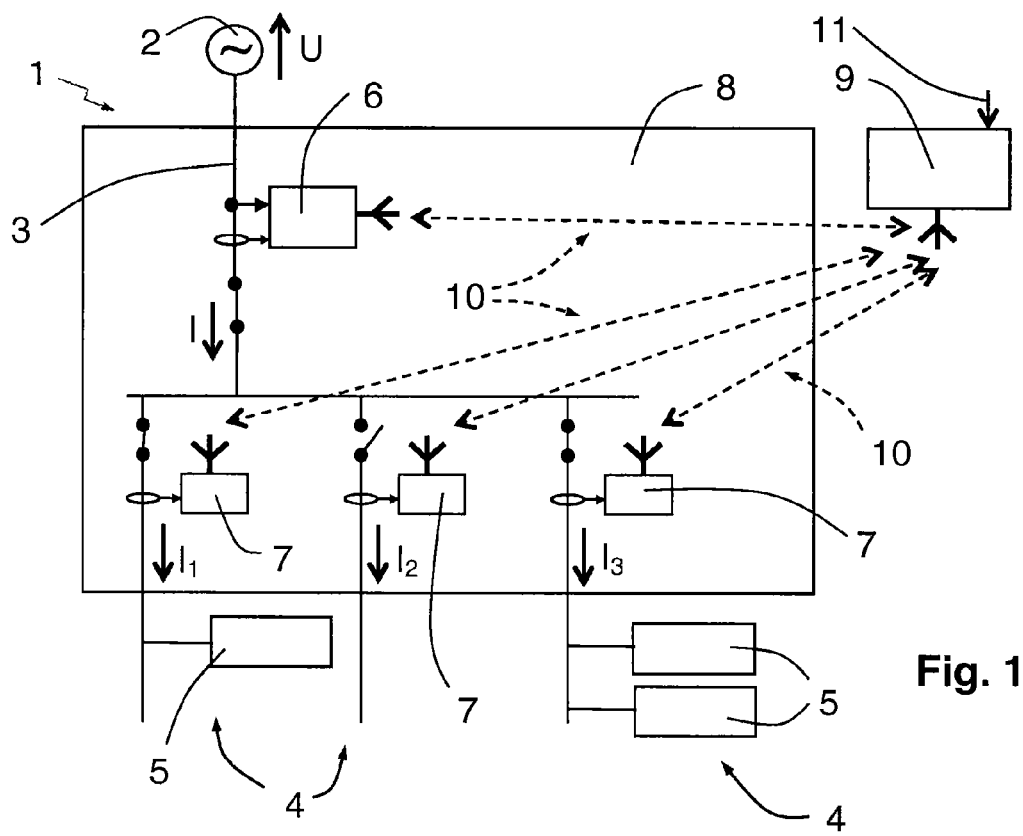
FIG. 1 is a simplified electrical diagram of an electrical installation according to the invention.

An electrical installation 1 suitable for implementation of a method according to the invention is represented in FIG. 1. For the sake of clarity, FIG. 1 is simplified and certain conventional constituent components are omitted from it. In particular, only the phase is represented, whereas the neutral is not.

The electrical installation 1 can belong to a final consumer and be located in a block or a building, such as a residential building or an office block, where there are several different loads to be supplied and where an electrical power distribution needs to be performed. This electrical installation 1 can in particular be that of a private home or that of residential lodgings.

The electrical installation 1 is supplied by an electrical power supply with sinusoidal alternating current 2, to which it is connected by an incomer 3 and which can in particular be a public electrical power distribution grid.

Several feeders are connected to the incomer 3. Each of them forms part of one of several branches 4 fitted in parallel, in which loads 5 to be supplied are connected. In the example represented, these branches 4 are three in number. Their number can of course be different from three.

The incomer 3 is equipped with an electricity consumption meter 6, which measures in time several quantities characteristic of the overall electricity supply of the group of branches 4, i.e. the overall supply voltage U and the intensity and phase shift values of the overall supply current I flowing in the incomer 3.

One or more branches 4 are each equipped with a current sensor or ampere meter 7. In the represented example, an ampere meter 7 measures the intensity of the individual current $I_1$, $I_2$ or $I_3$ in each branch 4. Reference numeral 8 designates a low-voltage general panel where several electric apparatuses are contained, including the electricity consumption meter 6 and ampere meters 7.

A computing device 9 collect and records in time, i.e. throughout operation of the electrical installation 1, measurements performed by the measuring instrumentation, i.e. the electricity meter 6 and ampere meters 7, which exchange with it by means of a wireless communication, such as a hertzian communication, symbolized by arrows 10. Although a wireless communication is preferred, the communication between the measuring instrumentation and computing device 9 can be hardwired or even mixed. The computing device 9 is equipped with at least one input/output port 11 by means of which it can communicate with an external device such as a configuration, monitoring and/or control computer.

The electricity consumption meter 6, ampere meters 7 and computing device 9 together form all or part of a monitoring system of operation of the electrical installation 1.

Figure 2:
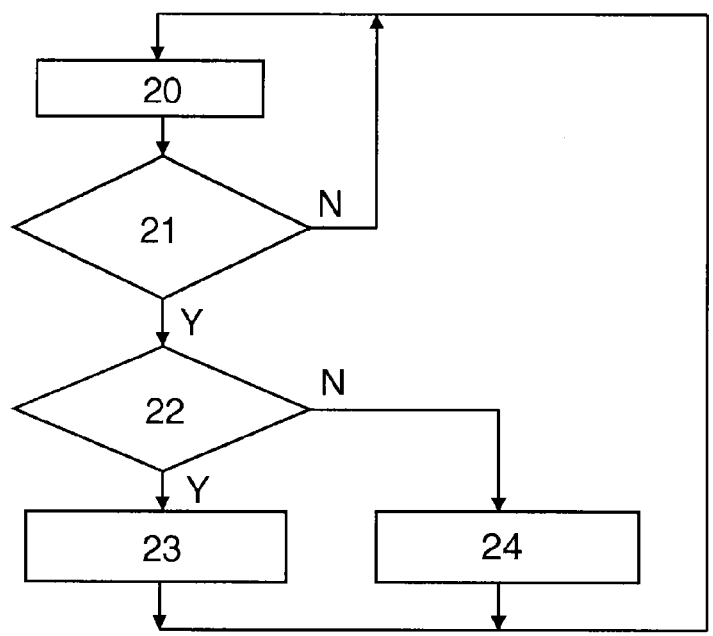
FIG. 2 is a flowchart of the operating logic of a method that is implemented in the scope of determination of an individual consumption constituting the overall consumption of the electrical installation of FIG. 1.

The computing device 9 conducts the method the logic of which is represented in FIG. 2. This method is suitable for the branches 4 in which the power consumption changes take place in steps due to the nature of their loads 5. In other words, it is suitable when the power consumed in a branch 4 is substantially stable between two changes.

In a first step 20 of the method schematized in FIG. 2, the computing device 9 monitors the occurrence of changes affecting the intensities of the currents in the branches 4 and/or the overall consumption of the electrical installation 1. When such a change has been detected, the computing device 9 goes on to a step 21 in which it performs filtering distinguishing significant and lasting changes from other insignificant and/or temporary changes.

The significant changes are defined as being greater than a predefined threshold which is chosen taking account of various data such as the type of use of the electrical installation 1. Temporary changes are defined as having a longer duration than a predefined time delay, for example about 2 to 3 s. In the case where a negative answer is received to the question of knowing whether the detected change is significant and lasting, the computing device 9 reverts to the monitoring step 20. In the opposite case, a step 22 is started.

After using the measurements of the intensities of the individual currents $I_1$ to $I_3$ to determine in which branch 4 the power consumption variation at the origin of the detected change took place, the computing device 9 answers a new question in step 22. This question consists in asking if the current in the branch 4 affected by the change of consumption was zero or not before the change.

In the case where the former individual current in the branch 4 affected by the change of consumption was zero, a simplified calculation is carried out in step 23 and consists in determining the individual power consumed in this branch after the change as being equal to the variation of the overall power consumed by the electrical installation and determined by the electricity consumption meter 6 or solely from its measurements of the quantities characteristic of the overall electrical power supply of the group of branches 4, i.e. of the voltage, intensity and phase shift values of this power supply.

If the individual current in the branch 4 where the change of power consumption occurred was not zero before the change, the computing device 9 executes step 24, in which it determines the new individual power consumed in this branch 4, by proceeding in a manner that is explained in the following by means of the Fresnel diagram of FIG. 3.

This way of proceeding considers that the electrical installation 1 is supplied by a substantially sinusoidal current, with little or no harmonic distortions. In case of harmonic distortions, the individual power determined by the computing device 9 will be less precise.

At least in the power calculation formulas presented in the following and/or in the appended claims, the voltage and intensity values mentioned are rms values.

Figure 3:
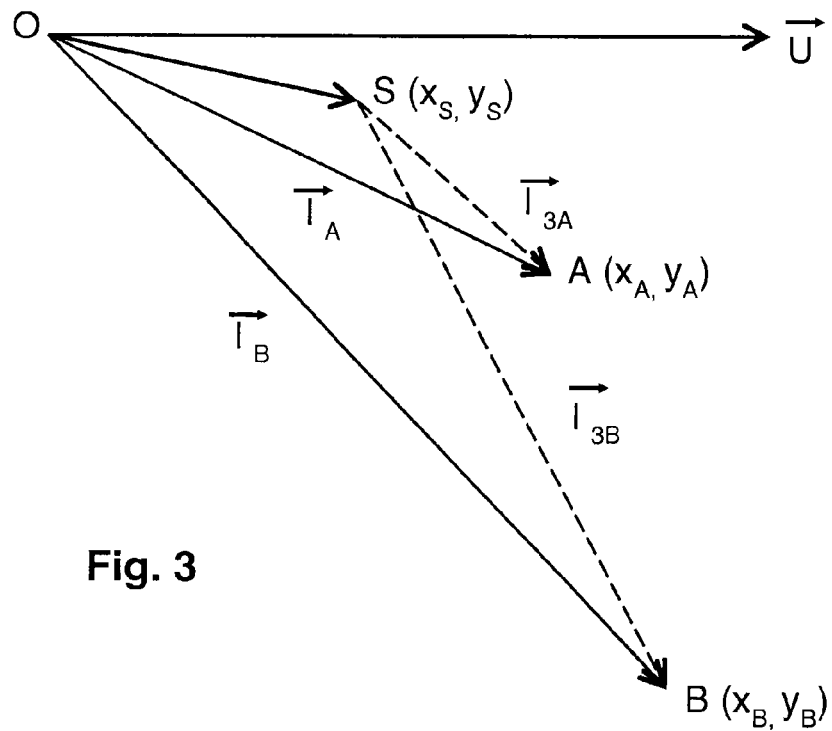
FIG. 3 is a Fresnel diagram illustrating how a step of a method according to the invention designed to determine the above-mentioned individual consumption is performed.

FIG. 3 considers more precisely the case of a change of power consumption occurring in the branch 4 where the individual current $I_3$ is flowing. Represented by the vector $\vec{U}$ in FIG. 3, the voltage at the terminals of each branch 4 is the overall supply voltage U of the installation 1. The change of power consumption only has a very slight if not insignificant effect on the latter. It is therefore considered that this overall voltage U is not modified when the change of power consumption takes place. This change does on the other hand affect the overall current I in the same way as the individual current $I_3$.

In FIG. 3, the vector $\vec{I}_A$ and the vector $\vec{I}_{3A}$ are respectively the graphic representation of the overall current I and the graphic representation of the individual current $I_3$ at the same time, which is a first time located before the change. The vector $\vec{I}_B$ and the vector $\vec{I}_{3B}$ are respectively the graphic representation of the overall current I and the graphic representation of the individual current $I_3$ at another time, which is a second time located after the change. Both the first and second times are chosen outside the change phase proper. In other words, each of them is located in a stabilized and constant operating phase of the electrical installation 1 so that transients are excluded therefrom.

The voltage, intensity and phase shift values measured by the meter 6 determine the vectors $\vec{U}$, $\vec{I}_A$ and $\vec{I}_B$, which are therefore known. The quantities characterizing the individual current $I_3$ are on the other hand not all measured. In fact only the intensities are measured, except for phase shifts, in so far as this individual current $I_3$ is concerned.

A power variation only occurred in the branch 4 where the current $I_3$ is flowing. The set of individual currents flowing in the other branches 4, therefore except for the individual current $I_3$, add up to a substantially unchanged sum between the first time before the change of power consumption and the second time after this change. In the example considered, this sum is the sum of the currents $I_1$ and $I_2$. Its graphic representation in FIG. 3 is the vector $\vec{OS}$, where O is the origin of an orthonormal coordinates system.

As this vector $\vec{OS}$ is the same before and after the change, the following therefore both have to be met:

that $\vec{OS} + \vec{I}_{3A} = \vec{I}_A (=\vec{OA})$, and that $\vec{OS} + \vec{I}_{3B} = \vec{I}_B (=\vec{OB})$.

This is illustrated by FIG. 3.

The norm of the vector $\vec{I}_{3A}$ is the measurement $I_{3A}$ of the current intensity $I_3$ before the change. The norm of the vector $\vec{I}_{3B}$ is the measurement $I_{3B}$ of the current intensity $I_3$ after the change. The point S is the intersection of two circles, i.e. a circle with centre A and with an intensity radius $I_{3A}$ of the current $I_3$ as measured before the change and a circle with centre B and with an intensity radius $I_{3B}$ of the current $I_3$ as measured after the change.

On the basis of the foregoing, a first way of proceeding is to numerically solve a system of two equations with two unknowns, as follows:

$$\begin{cases} (X_A - X_S)^2 + (Y_A - Y_S)^2 = I_{3A}^2 \\ (X_B - X_S)^2 + (Y_B - Y_S)^2 = I_{3B}^2 \end{cases} \quad (1)$$

$X_A$ and $Y_A$ are the cartesian coordinates of the vector $\vec{I}_A$ in the above-mentioned orthonormal reference system, only the origin O of which is represented for the sake of clarity.

$X_B$ and $Y_B$ are the Cartesian coordinates of the vector $\vec{I}_B$ in the same above-mentioned orthonormal reference system.

$X_S$ and $Y_S$ are two unknowns and are the Cartesian coordinates of the vector $\vec{OS}$, again in the same orthonormal reference system.

The computing device 9 can solve the system (1) of equations with two unknowns by means of a mathematical numerical resolution method which is based on a progressive variation of $X_S$ and $Y_S$, being controlled by a relevant convergence criterion.

For example, a numerical determination method of the point S can consist in moving step by step on one of the above-mentioned circles, which are the circle with centre A and intensity radius $I_{3A}$ and the circle with centre B and intensity radius $I_{3B}$. At each step on one of the circles, it is checked whether or not the location is in the immediate vicinity to the other circle.

Figure 4:
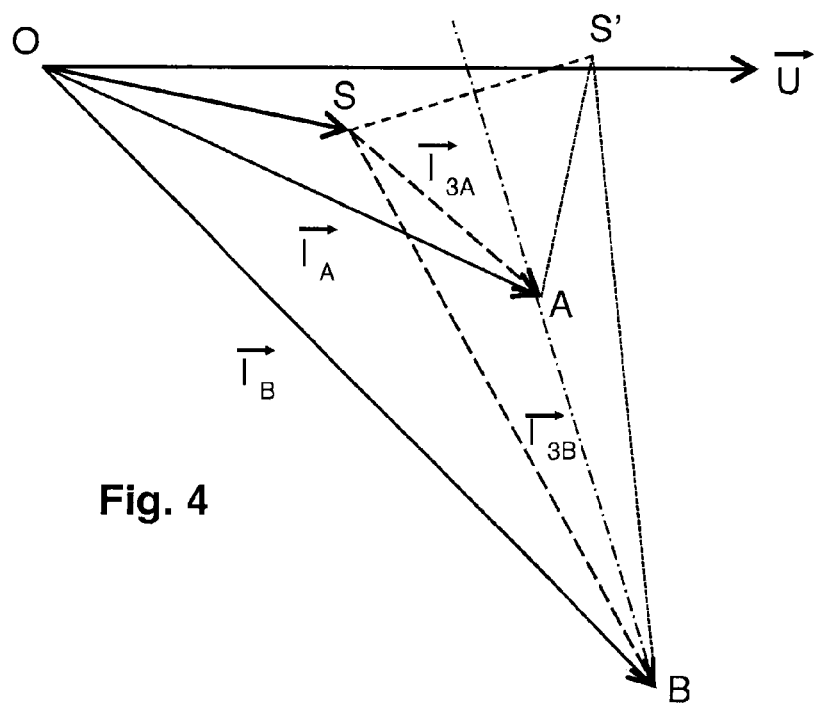
FIG. 4 is a Fresnel diagram carrying on from that of FIG. 3 and which further indicates complementary details concerning an operation included in a first way of performing the step schematized in this FIG. 3.

It should be noted that system (1) has two solutions which correspond to the points S and S' in FIG. 4. The point S' corresponds to a physically aberrant solution which has to be eliminated to only keep the other solution, that corresponding to the point S.

Elimination of the point S' can be performed by calculating, for each of the points S and S', the active and reactive powers before and after the observed power variation and in only retaining the one of the two points S and S' for which these powers meet the following criteria:

the active powers before and after the power variation have to be positive, considering that the loads 5 are assumed to consume and not to supply active power, the reactive powers before and after the power variation have to be of the same sign and be consistent with the nature of the load or loads 5 in the branch 4, i.e. positive in the case of capacitive loads 5 and negative in the case of inductive loads 5.

Once the point S has been determined, the vector $\vec{I}_{3B}$ and the intensity and phase shift values characteristic of the new current $I_3$ are easily determined by means of the following relation: $\vec{I}_{3B} = \vec{I}_B - \vec{OS}$.

The new power $P_{3B}$, i.e. subsequent to the change and consumed in the branch 4 where the current $I_3$ is flowing, is then calculated by the computing device 9 as being the scalar product of the vectors $\vec{U}$ and $\vec{I}_{3B}$: $P_{3B} = \vec{U} \cdot \vec{I}_{3B}$. The former power $P_{3A}$ in this branch 4 can also be calculated, in similar manner, i.e. by means of the relation $P_{3A} = \vec{U} \cdot \vec{I}_{3A}$.

Figure 5:
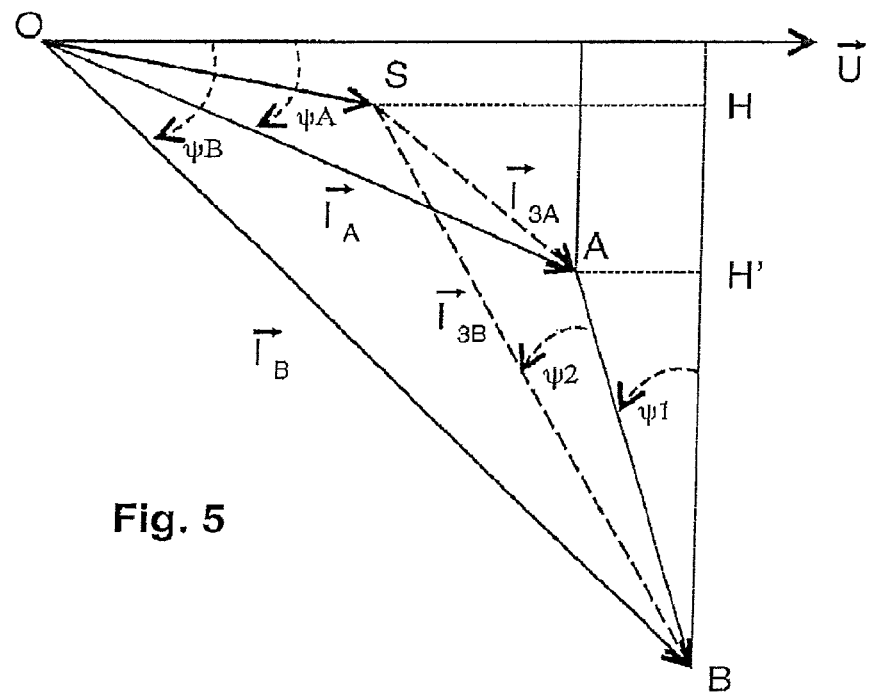
FIG. 5 is a Fresnel diagram also carrying on from that of FIG. 3 and which further indicates complementary details concerning a second way of performing the step schematized in this FIG. 3.

FIG. 5 illustrates geometric and trigonometric relations which are used in the second way of proceeding to determine the power consumed in the branch 4 where the current $I_3$ is flowing. Instead of or as a complement to the first way of proceeding set out in the foregoing, the computing device 9 can implement this second way of proceeding which is based on analytical calculation and which will now be dealt with.

In the triangle AOB visible in FIG. 5, we have the following relation:

$$AB^2 = I_A^2 + I_B^2 - 2 \times I_A \times I_B \times \cos(\text{angle } AOB) \quad (2)$$

$I_A$ and $I_B$ are respectively a measurement of the intensity of the former overall current I (before the change) and a measurement of the intensity of the new overall current I (after the change).

From relation (2), the following equality is deduced:

$$AB = \sqrt{I_A^2 + I_B^2 - 2 \times I_A \times I_B \times \cos(\psi_B - \psi_A)} \quad (3)$$

$\psi_A$ and $\psi_B$ are respectively a measurement of the phase shift of the former overall current I and a measurement of the phase shift of the new overall current I.

According to the second way of proceeding, the computing device 9 determines the intensity value AB by means of the equality (3).

Furthermore, we have the following relation:

$$P_B - P_A = U \times AB \times \sin(\psi_1) \quad (4)$$

$P_A$ is the former overall power consumed by the electrical installation 1, i.e. by the set of branches 4, as measured by the meter 6 before the change. $P_B$ is the new overall power consumed by this electrical installation 1, as measured by the meter 6 after the change. U is a measurement of the overall voltage at the terminals of the group of branches 4.

From relation (4), the following equality is deduced:

$$\psi_1 = \arcsin\left(\frac{I_B \times \cos\psi_B - I_A \times \cos\psi_A}{AB}\right) \quad (5)$$

According to the second way of proceeding, the computing device 9 determines the value of angle $\psi_1$ by means of the equality (5).

In the triangle ABS visible in FIG. 5, we have the following relation:

$$SA^2 = SB^2 + AB^2 - 2 \times SB \times AB \times \cos \psi_2 \quad (6)$$

From relation (6), the following equality is deduced:

$$\psi_2 = \arccos\left(\frac{I_{3B}^2 + AB^2 - I_{3A}^2}{2 \times I_{3B} \times AB}\right) \quad (7)$$

According to the second way of proceeding, the computing device 9 determines the value of angle $\psi_2$ by means of the equality (7).

Furthermore, we have the following relation:

$$SH = SB \times \sin(\psi_1 + \psi_2) \quad (8)$$

From relation (8), the following equality is deduced:

$$P_{3B} = U \times I_{3B} \times \sin(\psi_1 + \psi_2) \quad (9)$$

According to the second way of proceeding, the computing device 9 uses the equality (9) to determine the new individual power $P_{3B}$ in the branch 4 where the current $I_3$ is flowing.

Naturally, the formulas used can present another form than equalities (3), (5), (7) and (9), while remaining within the second way of proceeding which has just been dealt with. For example, equalities (3), (5), (7) and (9) can be combined in the direction of a reduction of the number of formulas used. In particular, equality (3) can be incorporated in equality (5), and also in equality (7), whereas these equalities (5) and (7) can be incorporated in equality (9).

The computing device 9 can also determine the phase shift $\psi_{3B}$ of the new current $I_3$, i.e. of the current $I_3$ after the change, by means of the following relation:

$$\psi_{3B} = \pi/2 - (\psi_1 + \psi_2) \quad (10)$$

The computing device 9 can also determine the former individual power $P_{3A}$, i.e. the power consumed before the change, in the branch 4 where the current $I_3$ is flowing. To do this, it can use the following relation:

$$P_{3A} = P_{3B} - (P_B - P_A) \quad (11)$$

The computing device 9 can also determine the new individual reactive power $Q_{3B}$, i.e. the reactive power after the change, in the branch 4 where the current $I_3$ is flowing. To do this, it can use the following relation:

$$Q_{3B} = U \times I_{3B} \times \cos(\psi_1 + \psi_2) \quad (12)$$

The computing device 9 can also determine the former individual reactive power $Q_{3A}$, i.e. the reactive power before the change, in the branch 4 where the current $I_3$ is flowing. To do this, it can use the following relation:

$$Q_{3A} = Q_{3B} - (Q_B - Q_A) \quad (13)$$

Like the first way of proceeding using a numerical resolution, the second way of proceeding based on a trigonometric resolution gives two solutions which correspond to the points S and S' of FIG. 4. These two solutions arise from the fact that the arcsinus calculation in formula (5) can be attributed a positive or negative value. The aberrant solution corresponding to the point S' is eliminated in the second way of proceeding as it is in the first way of proceeding.

From their descriptions above in the case of single-phase, the two possible ways of proceeding in step 24 can be transposed without any particular difficulty to the case of an electrical installation for multiphase currents. For the sake of clarity, their transpositions to this case of an electrical installation for multiphase currents are not described in detail in the following.

The invention is not limited to the embodiments described in the foregoing. In particular, it is not limited to the case of a single-phase alternating current, but can on the contrary also be implemented in electric installations for multiphase currents. Furthermore, the scope of the invention the covers both medium and high voltage as well as low voltage, even if the example described in the foregoing is situated in the low voltage field.

The invention claimed is:

1. A method for determining a power consumption in an electrical installation, wherein a plurality of distribution branches connected in parallel is connected to an alternating current power supply, the method comprising:

measuring and recording an overall supply voltage of the group of plural plurality of distribution branches, and measuring and recording first intensity and first phase shift values of an overall supply current of the plurality of distribution branches;

measuring and recording a first intensity of a specific individual current flowing in a specific branch among the plurality of distribution branches, the first intensity of the specific individual current being measured from a current sensor located in the specific branch;

detecting a change in the power consumption, the change affecting the first intensity of the specific individual current flowing in the specific branch;

determining, by circuitry, whether the change is greater than a predetermined threshold;

measuring and recording, when the change is greater than the predetermined threshold, second intensity and second phase shift values of the overall supply current of the plurality of distribution branches after the change;

measuring and recording, when the change is greater than the predetermined threshold, a second intensity of the specific individual current flowing in the specific branch after the change, the second intensity of the specific individual current being measured from the current sensor, and determining, by the circuitry based on the measuring of the overall supply voltage the measuring of the first intensity and first phase shift values of the overall supply current before the change and the measuring of the second intensity and second phase shift values of the overall supply current after the change, and the measuring of the first intensity of the specific individual current before the change and the measuring of the second intensity of the specific individual current after the change, an individual power consumption in the specific branch.

2. The method according to claim 1, wherein the individual power consumption is determined by adding up, as an unchanged sum, a plurality of individual currents flowing in the plurality of distribution branches with exception of the specific individual current flowing in the specific branch on completion of the change, with respect to the measuring of the first intensity and first phase shift values of the overall supply current before the change, and following two conditions are simultaneously fulfilled:
the overall supply current before the change is equal to the a first amount of adding the unchanged sum to the specific individual current before the change, and
the overall supply current after the change is equal to a second amount of adding the unchanged sum to the specific individual current after the change.

3. The method according to claim 2, further comprising:
determining, by the circuitry based on the measuring of the first intensity and first phase shift values of the overall supply current before the change and the measuring of the second intensity and second phase shift values of the overall supply current after the change, and the measuring of the first intensity of the specific individual current before the change and the measuring of the second intensity of the specific individual current after the change, the unchanged sum of the plurality of individual currents;
determining, by the circuitry, which component has to be added to the unchanged sum of the plurality of individual currents to obtain the overall supply current, this component being a determination of the specific individual current;
calculating, by the circuitry, the individual power as the product of the overall supply voltage and of the specific individual current.

4. The method according to claim 3, wherein the unchanged sum of the plurality of individual currents is determined by numerically solving following equations:

$$\begin{cases} (X_A - X_S)^2 + (Y_A - Y_S)^2 = I_{3A}^2 \\ (X_B - X_S)^2 + (Y_B - Y_S)^2 = I_{3B}^2 \end{cases}$$

wherein $I_{3A}^2$ and $I_{3B}^2$ are respectively a measurement to the square of the first intensity of the specific individual current before the change and a measurement to the square of the second intensity of the specific individual current after the change, wherein $X_A$ and $Y_A$ are respectively x-axis and y-axis in cartesian coordinates of vector representation ($\vec{I_A}$) of the overall supply current as measured before the change, in a Fresnel diagram, $X_B$ and $Y_B$ are respectively x-axis and y-axis in the cartesian coordinates of vector representation ($\vec{I_B}$) of the overall supply current as measured after the change, in the Fresnel diagram, and $X_S$ and $Y_S$ are two unknowns and are respectively x-axis and y-axis in the cartesian coordinates of vector representation of said unchanged sum of the plurality of individual currents, in the Fresnel diagram, before and after the change.

5. The method according to claim 2, further comprising:
determining an intensity value AB by following relation:

$$AB = \sqrt{I_A^2 + I_B^2 - 2 \times I_A \times I_B \times \cos(\psi_B - \psi_A)}$$

where $I_A$ and $\psi_A$ are respectively a measured first intensity and first phase shift of the overall supply current before the change and $I_B$ and $\psi_B$ are respectively a measured second intensity and second phase shift of the overall supply current after the change, determining an angle value $\psi_1$ by following relation:

$$\psi_1 = \arcsin\left(\frac{I_B \times \cos\psi_B - I_A \times \cos\psi_A}{AB}\right),$$

determining an angle value $\psi_2$ by the following relation:

$$\psi_2 = \arccos\left(\frac{I_{3B}^2 + AB^2 - I_{3A}^2}{2 \times I_{3B} \times AB}\right)$$

where $I_{3A}$ and $I_{3B}$ are respectively a measurement of the first intensity of the specific individual current before the change and a measurement of the second intensity of the specific individual current after the change.

6. The method according to claim 5, further comprising:
determining the individual power after the change by the following relation:

$$P_{3B} = U \times I_{3B} \times \sin(\psi_1 + \psi_2)$$

wherein $P_{3B}$ and U are respectively said individual power after the change and the measuring of the overall supply voltage.

7. The method according to claim 5, further comprising:
determining the second phase shift of the specific individual current after the change by the following relation:

$$\psi_{3B} + \pi/2 - (\psi_1 + \psi_2)$$

wherein $\psi_{3B}$ is the second phase shift of the specific individual current after the change.

8. The method according to claim 1, wherein an aberrant solution among two possible solutions is eliminated.

9. The method according to claim 1, wherein the current sensor includes an ampere meter.

10. An alternating current electrical installation comprising:
a plurality of distribution branches connected in parallel; and
a monitoring system including circuitry, the circuitry configured to:
measure and record an overall supply voltage of the plurality of distribution branches, and measure and record first intensity and first phase shift values of the overall supply current of the plurality of distribution branches;
measure and record a first intensity of a specific individual current flowing in a specific branch among the plurality of distribution branches, the first intensity of the specific individual current being measured from a current sensor located in the specific branch;
detect a change in the power consumption, the change affecting the first intensity of the specific individual current flowing in the specific branch;
determine whether the change is greater than a predetermined threshold;

measure and record, when the change is greater than the predetermined threshold, second intensity and second phase shift values of the overall supply current of the plurality of distribution branches after the change;

measure and record, when the change is greater than the predetermined threshold, a second intensity of the specific individual current flowing in the specific branch after the change, the second intensity of the specific individual current being measured from the current sensor; and determine, based on the measuring of the overall supply voltage, the measuring of the first intensity and first phase shift values of the overall supply current before the change and the measuring of the second intensity and second phase shift values of the overall supply current after the change, and the measuring of the first intensity of the specific individual current before the change and the measuring of the second intensity of the specific individual current after the change, an individual power consumption in the specific branch.

11. The alternating current electrical installation according to claim 10, wherein the current sensor includes an ampere meter.

12. An electrical installation, wherein a plurality of distribution branches connected in parallel is connected to an alternating current power supply, the electrical installation comprising:

circuitry configured to:

measure and record an overall supply voltage of the plurality of distribution branches, and measure and record first intensity and first phase shift values of the overall supply current of the plurality of distribution branches;

measure and record a first intensity of a specific individual current flowing in a specific branch among the plurality of distribution branches, the first intensity of the specific individual current being measured from a current sensor located in the specific branch;

detect a change in the power consumption, the change affecting the first intensity of the specific individual current flowing in the specific branch;

determine whether the change is greater than a predetermined threshold;

measure and record, when the change is greater than the predetermined threshold, second intensity and second phase shift values of the overall supply current of the plurality of distribution branches after the change;

measure and record, when the change is greater than the predetermined threshold, a second intensity of the specific individual current flowing in the specific branch after the change, the second intensity of the specific individual current being measured from the current sensor; and determine, based on the measuring of the overall supply voltage the measuring of the first intensity and first phase shift values of the overall supply current before the change and the measuring of the second intensity and second phase shift values of the overall supply current after the change, and the measuring of the first intensity of the specific individual current before the change and the measuring of the second intensity of the specific individual current after the change an individual power consumption in the specific branch.

* * * * *